United States Patent
Aihara

(10) Patent No.: US 6,278,900 B1
(45) Date of Patent: Aug. 21, 2001

(54) AUDIO STORING AND REPRODUCING APPARATUS

(75) Inventor: Fumikazu Aihara, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 08/981,648

(22) PCT Filed: May 9, 1997

(86) PCT No.: PCT/JP97/01558

§ 371 Date: Jan. 7, 1998

§ 102(e) Date: Jan. 7, 1998

(87) PCT Pub. No.: WO97/43765

PCT Pub. Date: Nov. 20, 1997

(30) Foreign Application Priority Data

May 16, 1996 (JP) .................................................. 8-122051

(51) Int. Cl.[7] .............................. G06F 17/00; G10L 11/00
(52) U.S. Cl. ............................ 700/94; 704/270; 704/278; 381/123
(58) Field of Search ............................. 700/94; 704/270, 704/278; 381/123; 369/13, 14, 15, 34, 35, 33, 32; 711/1, 111, 147, 148, 150, 200, 209; 340/692

(56) References Cited

U.S. PATENT DOCUMENTS

| | | | |
|---|---|---|---|
| 4,835,734 | * | 5/1989 | Kodaira et al. ...................... 711/209 |
| 4,985,828 | * | 1/1991 | Shimizu et al. ...................... 711/209 |
| 5,584,015 | * | 12/1996 | Villette et al. ........................ 711/209 |
| 5,604,479 | * | 2/1997 | Chang .................................... 704/270 |
| 5,758,177 | * | 5/1998 | Gulick et al. .......................... 704/270 |
| 5,774,131 | * | 6/1998 | Kim ....................................... 704/270 |
| 5,802,541 | * | 9/1998 | Reed .......................................... 711/1 |
| 6,088,758 | * | 7/2000 | Kaufman et al. ...................... 711/100 |

FOREIGN PATENT DOCUMENTS

| | | |
|---|---|---|
| 42 07 447 A1 | 9/1993 | (DE) . |
| 0 588 274 A1 | 3/1994 | (EP) . |
| 2 223 620 A | 4/1990 | (GB) . |
| 2 253 078 A | 8/1992 | (GB) . |
| WO 92/11626 | 7/1992 | (WO) . |

* cited by examiner

Primary Examiner—Xu Mei
(74) Attorney, Agent, or Firm—Frishauf, Holtz, Goodman, Langer & Chick, P.C.

(57) ABSTRACT

An audio storing and reproducing apparatus is provided that has a semiconductor chip and a control unit. The semiconductor chip includes a semiconductor memory having a plurality of storage areas, a single storage specifying input terminal, a single reproduce specifying input terminal, and a storage medium controller that controls storing of the audio data to the storage areas and readout of the audio data therefrom in accordance with the signal input to the storage specifying and reproduce specifying input terminals. The control unit includes a single storage area specifying switch, a single storage specifying switch, a single reproduce specifying switch and a control circuit. The control circuit send a storage area specifying signal to the storage specifying input terminal when the storage area specifying switch is operated, generates a storage specifying signal after sending of the storage area specifying signal to the storage specifying input terminal when the storage specifying switch is operated, and sends a reproduce specifying signal to the reproduce specifying input terminal when the reproduce specifying switch. Thus, recording on and reproducing from the plural storage areas of the semiconductor memory is selectively performed in accordance with the signals input to two input terminals—i.e., the storage specifying input terminal and reproduce specifying input terminal.

14 Claims, 8 Drawing Sheets

US 6,278,900 B1

AUDIO STORING AND REPRODUCING APPARATUS

TECHNICAL FIELD

This invention relates to an audio storing and reproducing apparatus for storing audio data and reproducing the stored audio data.

BACKGROUND ART

There has been an audio storing and reproducing apparatus that encodes (A/D converts) an externally supplied audio signal, stores the resulting signal into a semiconductor memory, such as a RAM, reads the encoded signal from the RAM according to the operation of a reproduce switch or the like, and decodes (D/A converts) the read-out signal, and provides audio output, as disclosed in U.S. Pat. No. 4,368,988.

With the conventional audio storing and reproducing apparatus, when a single semiconductor memory is used as a single recording and reproducing apparatus, addressing is initiated, starting at the first address in a recording or reproducing operation. However, in a case where a single semiconductor memory is divided into blocks and the blocks are selectively recorded into or reproduced from, addressing must be initiated, starting at the begin address of the selected block. To do this, it is necessary to send data on the begin address of the selected block to the address control section, preset it, and update the addresses, starting at the begin address. When the encoded data is stored in a volatile memory, such as a RAM, the stored contents will disappear in the case of the expiration of the battery's service life, the replacement of the battery, or a power failure. To avoid the loss of the stored data, use of a nonvolatile memory, such as an EEPROM, can be considered. The EEPROM, however, requires a very high driving voltage, as compared with a CMOS circuit that operates on about 1 V, for example. For this reason, an electronic circuit for controlling a recording and reproducing operations that operates on a relatively low voltage and an electronic circuit including nonvolatile memories have to be composed of separate chips, which need to be controlled by different voltages separately. As described above, when the main circuit section and the electronic circuit including nonvolatile memories are assembled by separate chips and a single nonvolatile memory is divided into blocks as described earlier, and the blocks are selectively recorded into and reproduced from, the begin address of each block must be addressed directly, with the result that a plurality of terminals are needed as the input terminals for address data, which leads to the problem that the size of the chip including nonvolatile memories becomes large.

DISCLOSURE OF INVENTION

The object of the present invention is to provide an audio storing and reproducing apparatus that divides a memory into blocks and is capable of selectively storing or reproducing the data into or from the blocks on a block basis without complicating the circuit configuration.

The foregoing object is accomplished by providing an audio storing and reproducing apparatus comprising: a semiconductor chip including a semiconductor memory having a plurality of storage areas, a storage specifying input terminal to which a storage area specifying signal for specifying a storage area to be stored into or reproduced from the plurality of storage areas in the semiconductor memory and a storage specifying signal for specifying the storing of audio data are inputted, a reproduce specifying input terminal to which a reproduce specifying signal for specifying the reproducing of audio data is inputted, and storage medium control means for not only specifying a storage area to be stored into or reproduced from according to the storage area specifying signal and storing audio data into the specified storage area according to the storage specifying signal, but also reading the audio data stored in the specified storage area according to the reproduce specifying signal; and control means including storage area specifying switch means, record specifying switch means, reproduce specifying switch means, and a control circuit that sends the storage area specifying signal to the storage specifying input terminal when the storage area specifying switch means is operated, that sends the storage area specifying signal to the storage specifying input terminal and thereafter sends the record specifying signal when the record specifying switch means is operated, and that sends the reproduce specifying signal to the reproduce specifying input terminal when the reproduce specifying switch means is operated.

Because the storage specifying input terminal to which the storage area specifying signal and the storage specifying signal are inputted and the reproduce specifying input terminal to which the reproduce specifying signal is inputted connect the semiconductor chip to the control circuit, the audio storing and reproducing apparatus of the present invention has the advantage that the semiconductor memory can be divided into blocks and the blocks can be selectively recorded into or reproduced from block by block without complicating the circuit configuration or increasing the number of terminals of the semiconductor chip.

BEST MODE OF CARRYING OUT THE INVENTION

Hereinafter, referring to the accompanying drawings, an electronic wristwatch, a portable electronic apparatus, according to an embodiment of the present invention will be explained.

A. The Configuration of the Embodiment

Figure 1:
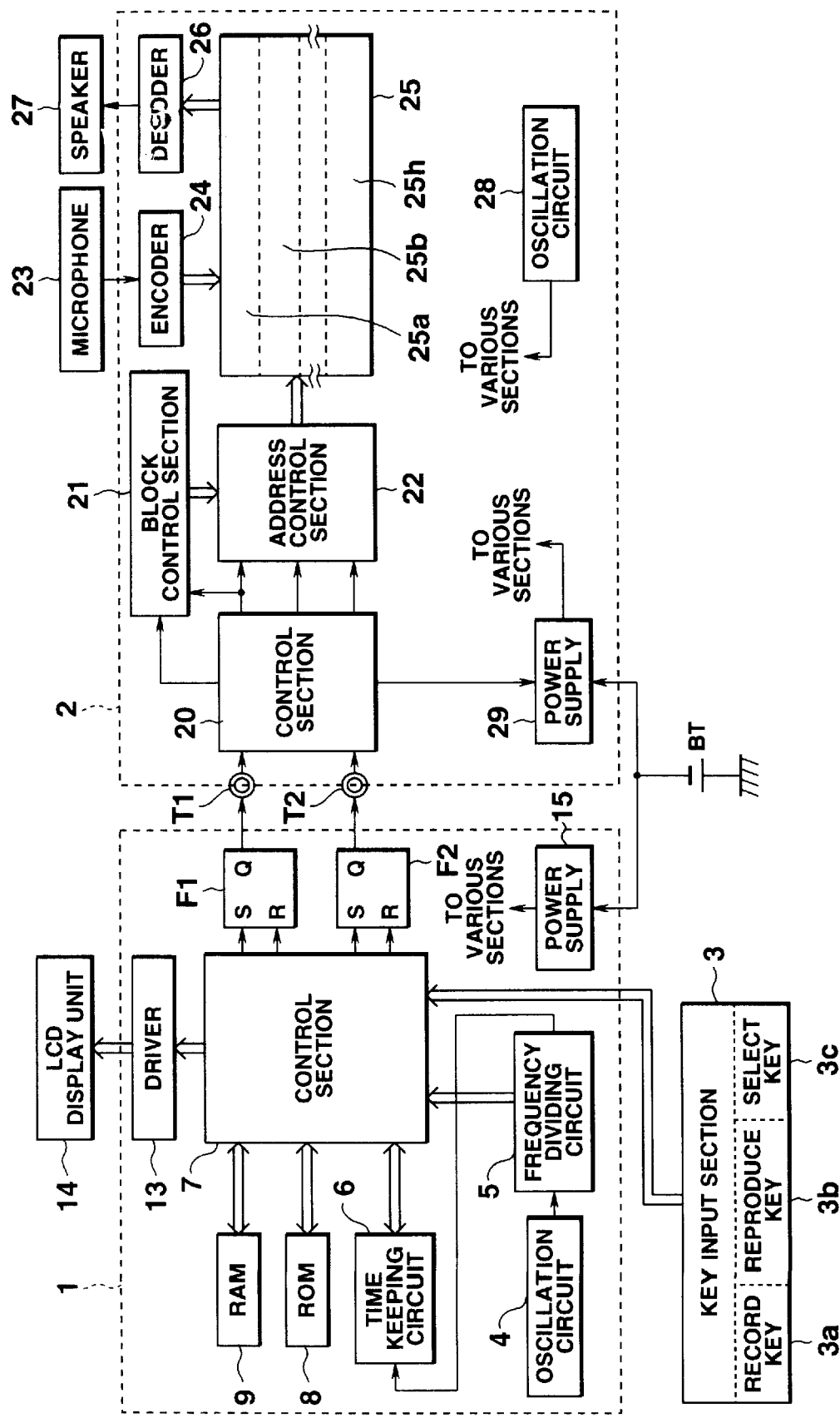
FIG. 1 is a block diagram of a portable electronic apparatus according to an embodiment of the present invention.

FIG. 1 is a block diagram of an electronic wristwatch according to the embodiment of the present invention. In the figure, the electronic wristwatch of the embodiment has a watch function, a computer function, a data bank function that stores a lot of name and telephone number data items and others and displays them, and a memo function that makes notes of externally supplied speech in memory and reproduces it. The electronic wristwatch comprises a one-chip control integrated circuit 1 composed of, for example, a C-MOS device which includes the processing circuitry for the watch function, computer function, and data bank function, and control means for controlling the recording and reproducing of speech, and a one-chip memory control integrated circuit 2 which includes a nonvolatile memory composed of, for example, a flash EEPROM in which audio data is stored, and control means for controlling the nonvolatile memory and the addresses. The control integrated circuit 1 and the memory control integrated circuit 2 operate on different driving voltages but receive a power supply from the same battery. They are designed to produce the necessary voltages in the power supply circuit in each integrated circuit.

First, the control integrated circuit 1 and its peripheral circuits will be explained. A key input section 3 includes numerical keys and character keys (not shown) for entering various types of data, a record key 3a for recording audio data, a reproduce key 3b for reproducing the recorded audio data, and a select key 3c for selecting a block into or from which the data is stored in or reproduced from the storage area blocks (eight) of an EEPROM 25 explained later. Each key input signal from the key input section 3 is sent to a control section 7, which then senses the key input.

An oscillation circuit 4 generates a reference clock of a specific frequency and supplies it to a frequency dividing circuit 5. The frequency dividing circuit 5, according to the reference clock, generates and outputs a system clock and various timing clocks for operating each part of a time keeping circuit 6, a control section 7, and the others. On the basis of the one-second signal, a reference signal for time keeping, of the timing clocks from the frequency dividing circuit 5, the time keeping circuit 6 clocks the present time (the date, the day of the week, hours, minutes, seconds) and supplies it to the control section 7.

The control section 7 is a CPU (central processing unit) that realizes the above-described various functions in the electronic wristwatch by executing the specific microprograms stored in a ROM 8 explained later. In the embodiment, in particular, the control section records and reproduces the audio data into and from the blocks obtained by dividing an EEPROM 25 explained later, through a process explained later. Specifically, the control section 7 forces the block recorded into and reproduced from to be shift one block circularly each time the select key 3c is pressed, thereby causing the desired block to be selected. When the record key 3a is pressed, the control section causes the audio data on the speech inputted from a microphone 5 to be stored into the selected block in the EEPROM 25. When the reproduce key 3b is pressed, the control section causes the audio data stored in the selected block in the EEPROM 25 to be reproduced. When both the record key 3a and the reproduce key 3b are pressed at the same time, the control section causes the various flags and the date and time data items stored in a RAM 9 explained later to be erased.

The ROM 8 stores the microprograms executed by the control section 7 and various initial parameters. The RAM 9 is used as a register and working area that store the various data items produced as a result of the execution of the programs at the control section 7.

Figure 2:
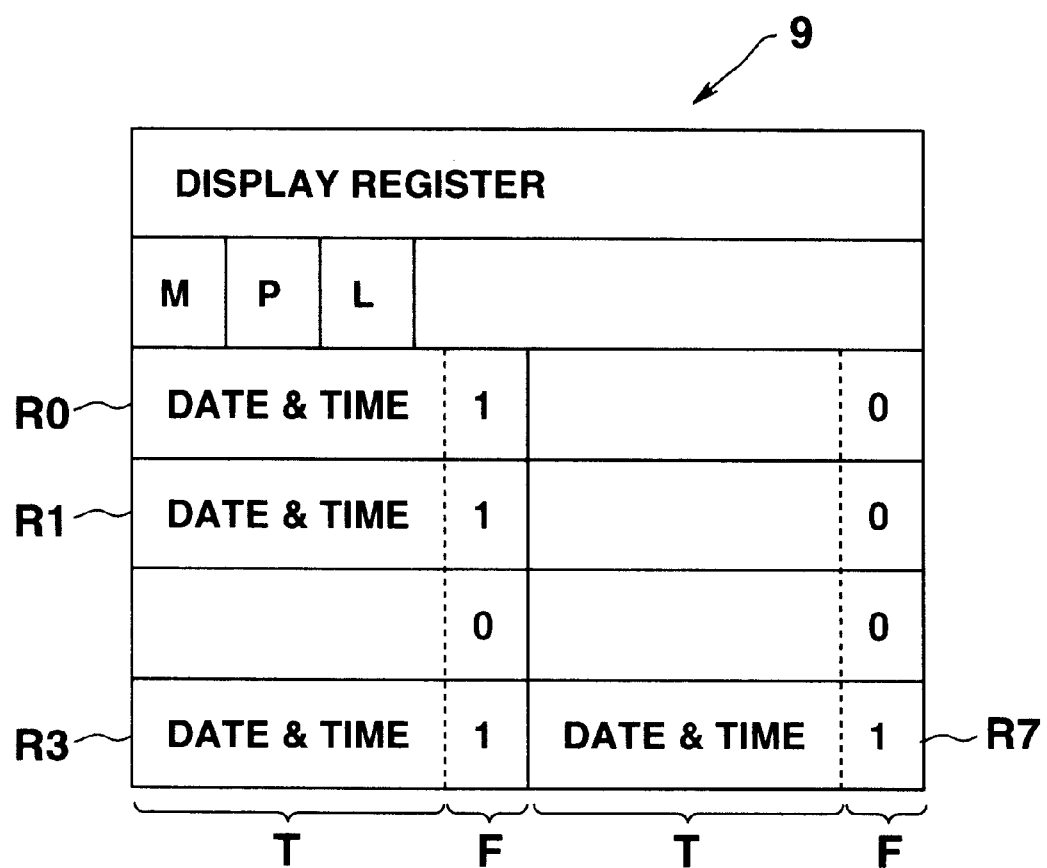
FIG. 2 is a conceptual drawing of the data structure of the RAM 9 in FIG. 1.

FIG. 2 is a conceptual drawing of the data structure of the RAM 9. In FIG. 2, a display register is a register for storing the data for displaying various data items on an LCD display unit (liquid-crystal display unit) 14 explained later. Register M is a register for specifying the specified recording/reproducing block of the eight blocks in the EEPROM 25 into which the audio data it to be stored.

Flag P is a flag for indicating that speech is now being recorded. When the flag is at "1," the speech inputted from the microphone 5 explained later is taken in via the encoding section (encoding circuit) 6 and is stored in the EEPROM 25 as audio data. Flag L is a flag indicating that speech is now being reproduced. When the flag is at "1," the audio data read from the EEPROM 25 is outputted to a speaker 11 explained later via a decoding section (decoding circuit) 10 explained later.

Each of registers R0, R1, . . . , R7 is a register having an area (register T) for storing the date and time that the audio data was recorded and flag F indicating whether or not the block has been recorded into. These registers R0, R1, . . . , R7 are provided for the blocks (eight blocks in the embodiment) in the EEPROM 25, respectively. When no audio data has been recorded, flag F is at "0." When audio data has been recorded, flag F is at "1." In the embodiment, because the EEPROM 25 has been divided into eight blocks as described above, register M is used to specify which block to be recorded into or reproduced from by 3-bit block specifying data.

In FIG. 1, a driver 13 displays on the LCD (liquid-crystal) display unit 14 various data items concerning the time, calculation data, and name and telephone number data supplied from the control section 7 and the audio data stored in the EEPROM 25. The LCD display unit 14 includes dot-matrix or segment type electrodes. In the clock mode, the LCD display unit displays the date, present time, and which blocks have been recorded into. In recording or reproducing the audio data, the LCD display unit displays at least the present time, the block now being recorded into, and the recording time as shown in a display example explained later.

The control section 7 sets or resets flip-flops F1 and F2 in the following three ways according to the operation of each of the record key 3a, reproduce key 3b, and select key 3c.

(1) Each time the select key 3c is pressed, the control section sets the set terminal of flip-flop F1 to "1," and then sets the reset terminal to "1," thereby sending one pulse of a 1/256 period (256 Hz) from the output Q of flip-flop F1 In the control section 20 of the memory control integrated circuit 2, the pulse is supplied to a block control section 21 as a block specifying signal BL for specifying a block in the EEPROM 25.

(2) When the record key 3a is pressed, first, the flip-flop F1 is set and reset seven times in a 1/256 period (256 Hz) and thereafter the control section sets the set terminal to "1" to force the output Q to "1." When the record key 3a is released, the control section sets the reset terminal of the flip-flop F1 to "1" to force the output Q to "0."

(3) When the reproduce key 3b is pressed, first, the flip-flop F2 is set and reset seven times in a 1/256 period (256 Hz) and thereafter the control section sets the set terminal to "1" to force the output Q to "1." When the reproduce key 3b is released, the control section sets the reset terminal of the flip-flop F2 to "1" to force the output Q to "0."

Each of the flip-flops F1 and F2 supplies to the control section 20 of the memory control integrated circuit 2 the output Q whose output level is turned on and off under the control of the control section 7. The power supply 15 converts the supply voltage from the common battery BT into a driving voltage for operating the control integrated circuit 1 and supplies the driving voltage to each of the above-described sections.

Next, the memory control integrated circuit 2 and its peripheral circuitry will be explained. On the basis of the output Q supplied from the flip-flop F1 in the control integrated circuit 1 and the output Q supplied from the flip-flop F2, the control section 20 generates a block signal for specifying a block in the EEPROM 25, a record signal that indicates recording, a reproduce signal that indicates reproducing, and a clear signal for erasing the recorded audio data and supplies the block signal and clear signal to the block control section 21 and the record signal, reproduce signal and clear signal to an address control section 22.

Figure 3:
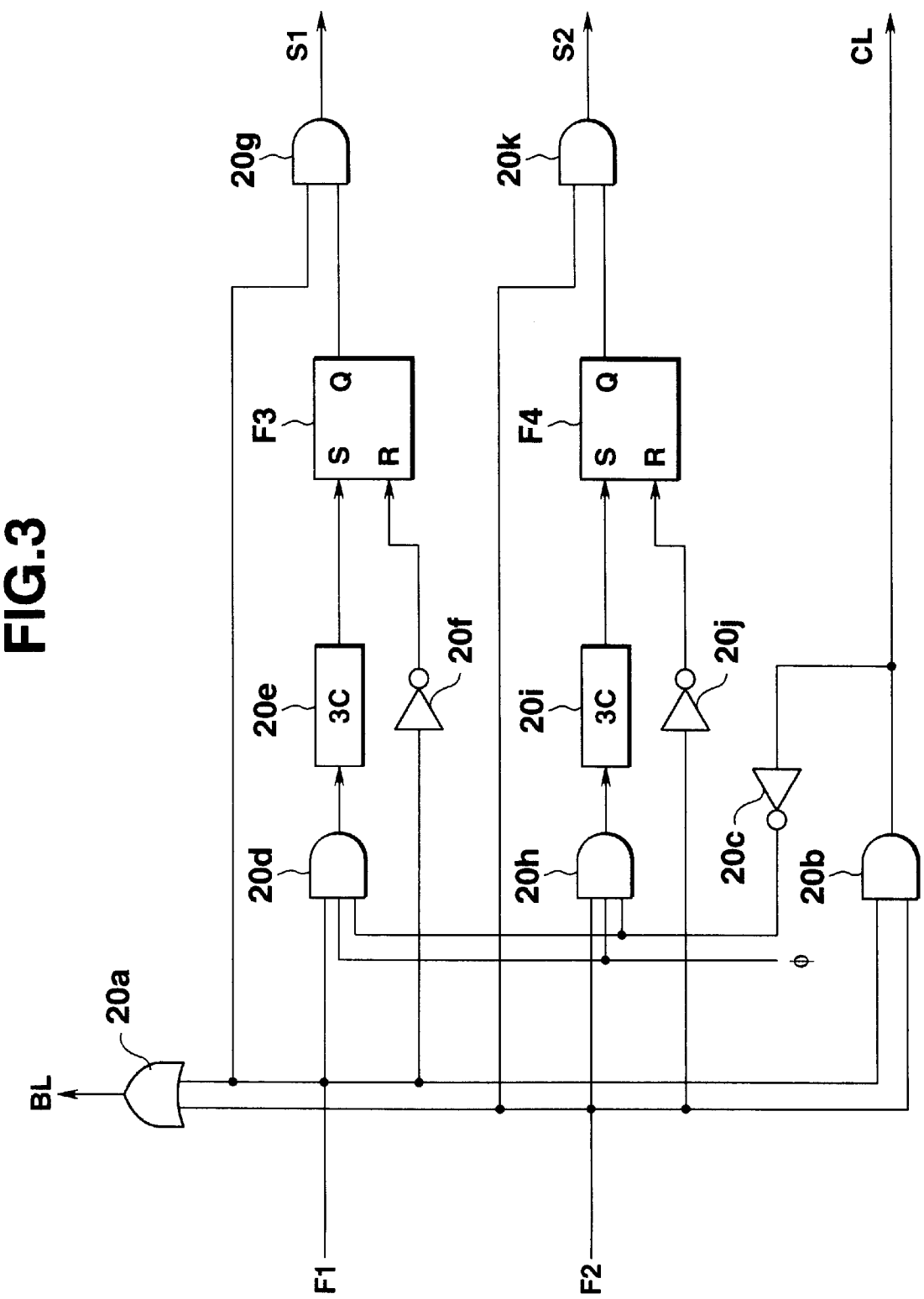
FIG. 3 is a circuit diagram of the control section 20 in FIG. 1.

FIG. 3 is a circuit diagram of the control section 20. In the figure, an OR circuit 20a produces a block signal BL that goes to "1" when either the output Q of the flip-flop F1 or the output Q of the flip-flop F2 goes to "1," and supplies the block signal BL to the block control section 21. Specifically, when either the flip-flop F1 or the flip-flop F2 supplies one pulse to the OR circuit, the OR circuit supplies one-pulse block signal to the block control section 21. An AND circuit 20b produces a clear signal CL that goes to "1" when both of the output Q of the flip-flop F1 and the output Q of the flip-flop F2 go to "1," and supplies the clear signal to the address control section 22. The clear signal CL is inverted by a NOT circuit 20c and the inverted signal is supplied to AND circuits 20d and 20h.

The AND circuit 20d supplies the output Q of the flip-flop F1 to a 3-bit shift register 20e when the clear signal CL is at 0 and clock φ (a 1/32 second period: 32 Hz) is at "1." The 3-bit shift register 20e shifts the stored bits in sequence and supplies a bit to the set terminal S of a flip-flop F3, each time the AND circuit 20d supplies the record control signal S1. Consequently, the 3-bit shift register 20e sets the flip-flop F3 when the fourth clock of clock φ is supplied to the AND circuit 20d. In other words, the flip-flop F3 is not set until the fourth clock of clock φ has been supplied to the flip-flop F3.

The flip-flop F3 is set (Q=1) when being supplied with the clock from the 3-bit shift register 20e. Because the flip-flop F3 is supplied with the reset signal via a NOT circuit 20f when the output Q of the flip-flop F1 goes to "0," the flip-flop F3 is reset (Q=0).

Since clock φ is determined to be at 32 Hz, even when the flip-flop F1 of FIG. 1 supplies a clock having a 1/256 period to the flip-flop F3, the flip-flop F3 is not set (Q=1) immediately, but is set (Q=1) 2/32 to 3/32 second later.

The output Q of the flip-flop F3 is supplied to one input terminal of an AND circuit 20g. The AND circuit 20g produces an output of "1" by ANDing the output Q of the flip-flop F1 with the output Q of the flip-flop F3, when both of the outputs of the flip-flops F1 and F3 are at "1," that is, during the time from 2/32 to 3/32 second later than the time that the flip-flop F1 first supplied a clock having a 1/256 period to the time when the flip-flop F1 has been reset. The AND circuit supplies the output "1" to the address control section 22 of FIG. 1 as a recording control signal S1.

As described above, when the record key 3a is pressed, the control section 7 sets the flip-flop F1 to turn on the record mode. With the embodiment, because the same flip-flop F1 is used to select a block in advance and then specify recording, the block signal BL is supplied to the block control section 21 via the OR circuit 20a when the record mode is turned on, so that the selected block is changed. To avoid this, in the embodiment, the block set in the block control section 21 is made the block immediately before the selected block by repeating the setting and resetting of the flip-flop F1 in a 1/256 period a specific number of times (the number of blocks−1: seven times in the embodiment) during 2/32 to 3/32 second after the record key 3a has been pressed. Thereafter, the flip-flop F1 is set.

As a result, setting the flip-flop F1 to turn on the record mode causes the recording control signal S1 for turning on the record mode to be supplied to the control section 20 and the block in the block control section 21 to be incremented by one in position, which makes the previously selected block be set again. With the embodiment, because the flip-flop F1 is set and reset in a 1/256 period and the recording control signal S1 is sent at the fourth clock of clock φ of a 1/32 period (32 Hz), the recording control signal S1 is not sent as long as the setting and resetting of the flip-flop F1 is repeated. Therefore, specifying both a block and record can be done using a single line.

Figure 4:
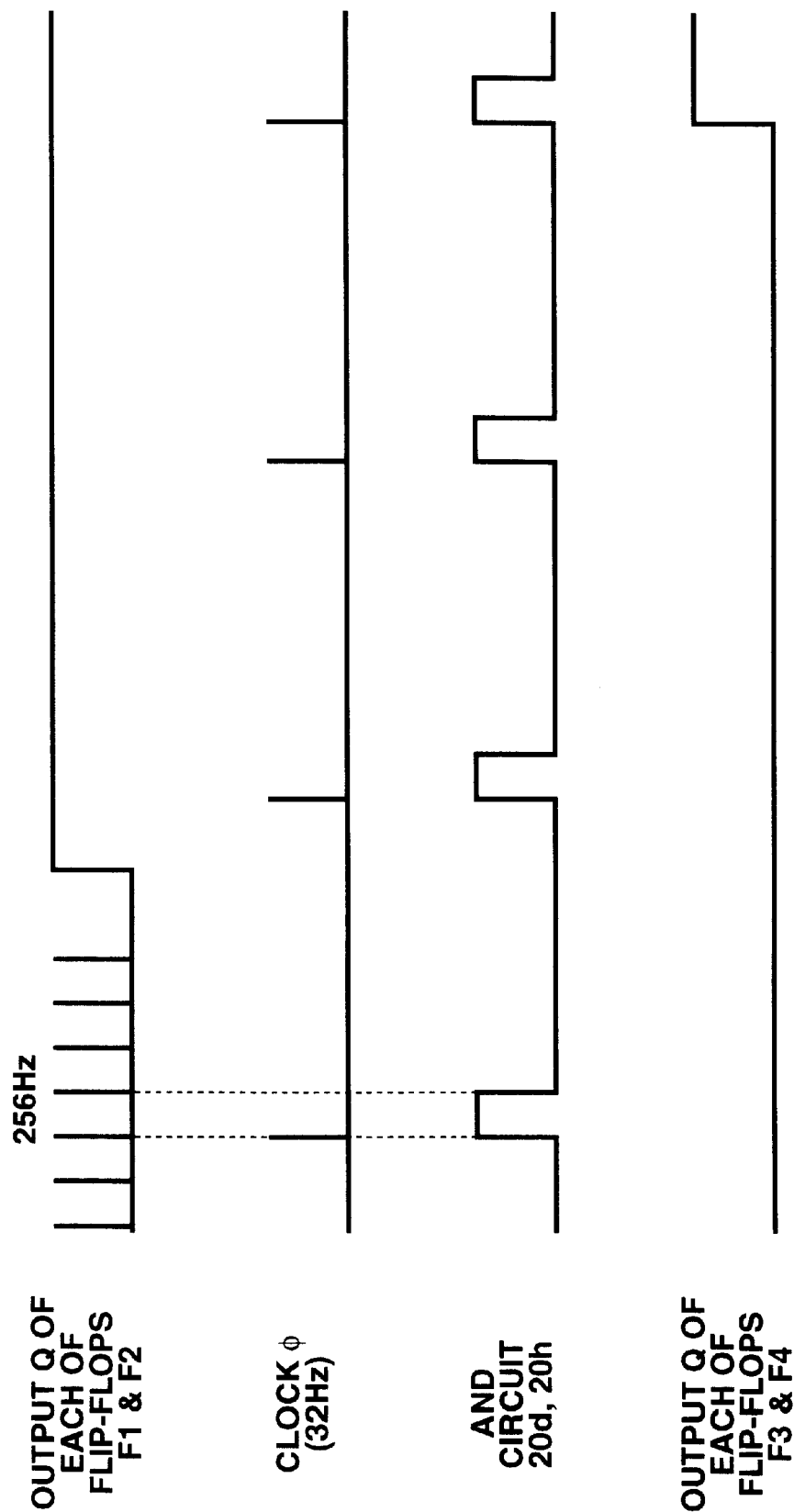
FIG. 4 is a conceptual drawing to help explain the relationship between the recording control signal S1 (256 Hz) and clock $\phi$ (32 Hz) in FIG. 3.

Next, when the clear signal CL is at "0" and clock φ (a 1/32 period: 32 Hz) is at "1," the AND circuit 20h supplies the output Q of the flip-flop F2 to a 3-bit shift register 20i. The 3-bit shift register 20i shifts the stored bits in sequence and supplies them to the set terminal S of the flip-flop F4, each time the AND circuit 20h supplies the reproducing control signal S2. As a result, when the fourth clock of clock φ has been supplied to the AND circuit 20h as shown in FIG. 4, the 3-bit shift register 20i sets the flip-flop F4. In other words, the flip-flop F4 is not set until the fourth clock of clock φ has been supplied to the AND circuit 20h.

Being supplied with the clock from the 3-bit shift register 20i, the flip-flop F4 is set (Q=1). When the output Q of the flip-flop F2 goes to "0," the reset signal is supplied to the flip-flop F4 via the NOT circuit 20j, so that the flip-flop F4 is reset (Q =0). Because the flip-flop F4 uses clock φ of 32 Hz, even when it is supplied with a clock having a 1/256 period from the flip-flop F2 shown in FIG. 1, it will not be set (Q=1) immediately, but be set (Q=1) 2/32 to 3/32 second later.

The output Q of the flip-flop F4 is supplied to one input terminal of the AND circuit 20k. The AND circuit 20k ANDs the output Q of the flip-flop F2 with the output Q of the flip-flop F4 and thereby produces an output of "1" while both of the outputs are at "1," that is, during the time from 2/32 to 3/32 second later than the time that the flip-flop F2 first supplied a clock having a 1/256 period to the time when the flip-flop F2 has been reset. The AND circuit 20k supplies the output "1" as a reproducing control signal S2 to the address control section 22 shown in FIG. 1.

As described above, when the reproduce key 3b is pressed, the control section 7 sets the flip-flop F2 to turn on the reproduce mode. With the embodiment, because the same flip-flop F2 is used to select a block in advance and then specify reproducing, the block signal BL is supplied to the block control section 21 via the OR circuit 20a when the reproduce mode is turned on, so that the selected block is changed. To avoid this, in the embodiment, as in the record mode, the block set in the block control section 21 is made the block immediately before the selected block by repeating the setting and resetting of the flip-flop F2 in a 1/256 period a specific number of times (the number of blocks−1: seven times in the embodiment) during 2/32 to 3/32 second after the record key 3b has been pressed. Thereafter, the flip-flop F2 is set.

Consequently, as in the record mode, setting the flip-flop F2 to turn on the record mode causes the reproducing control signal S2 for turning on the reproduce mode to be supplied to the control section 20 and the block in the block control section 21 to be incremented by one in position, which makes the previously selected block be set again. In this case, too, because the flip-flop F2 is set and reset in a 1/256 period and the reproducing control signal S2 is sent at the fourth clock of clock ϕ having a 1/32 period (32 Hz), the reproducing control signal S2 is not sent as long as the setting and resetting of the flip-flop F2 is repeated. Therefore, a single line is sufficient for reproduce purposes.

In FIG. 1, the block control section 21 is a 3-bit register, which counts the block signal BL supplied from the control section 20 and supplies the resulting signal to the address control section 22 as a block specifying data (three bits) BD indicating which block to be recorded into or reproduced from. The address control section 22 addresses and accesses the EEPROM 25 according to the recording control signal S1, reproducing control signal S2, clear signal CL and block specifying data BD supplied from the control section 20. The microphone 23 collects the speech of the user and supplies the audio signal to the encoding section 24. The encoding section 24, which includes an amplifier, a filter, an A/D converter circuit (all of these not shown), converts the audio signal into digital data (audio data) and supplies the converted signal to the EEPROM 25. The decoding section 26 coverts the audio data supplied from the storage area of the block in the EEPROM 25 accessed by the address control section 22 into an analog signal, which is then outputted from the speaker 27 as speech.

The EEPROM 25 is chiefly composed of about two megabits of flash memory, which has eight blocks 25a to 25h. The audio data taken in via the microphone 23 and encoding section 24 is stored into specific blocks in sequence according to access by the address control section 22. The oscillation circuit 28 generates clock ϕ, a specific clock for operating the EEPROM 25 and the others, and supplies the clock to the various sections, including the control section 20, address control section 22, and EEPROM 25. The power supply 29 converts the supply voltage from the common battery BT into a driving voltage for operating the memory control integrated circuit 2 and supplies the driving voltage to the various sections.

B. The operation of the Embodiment

Next, the operation of the electronic wristwatch of the embodiment will be explained. The clock function, computer function, and data bank function are the same as those of a conventional equivalent, so explanation of them will not be given. Hereinafter, the operation of recording and reproducing the audio data into and from the EEPROM 25 will be explained.

(1) Main Processing

Figure 5:
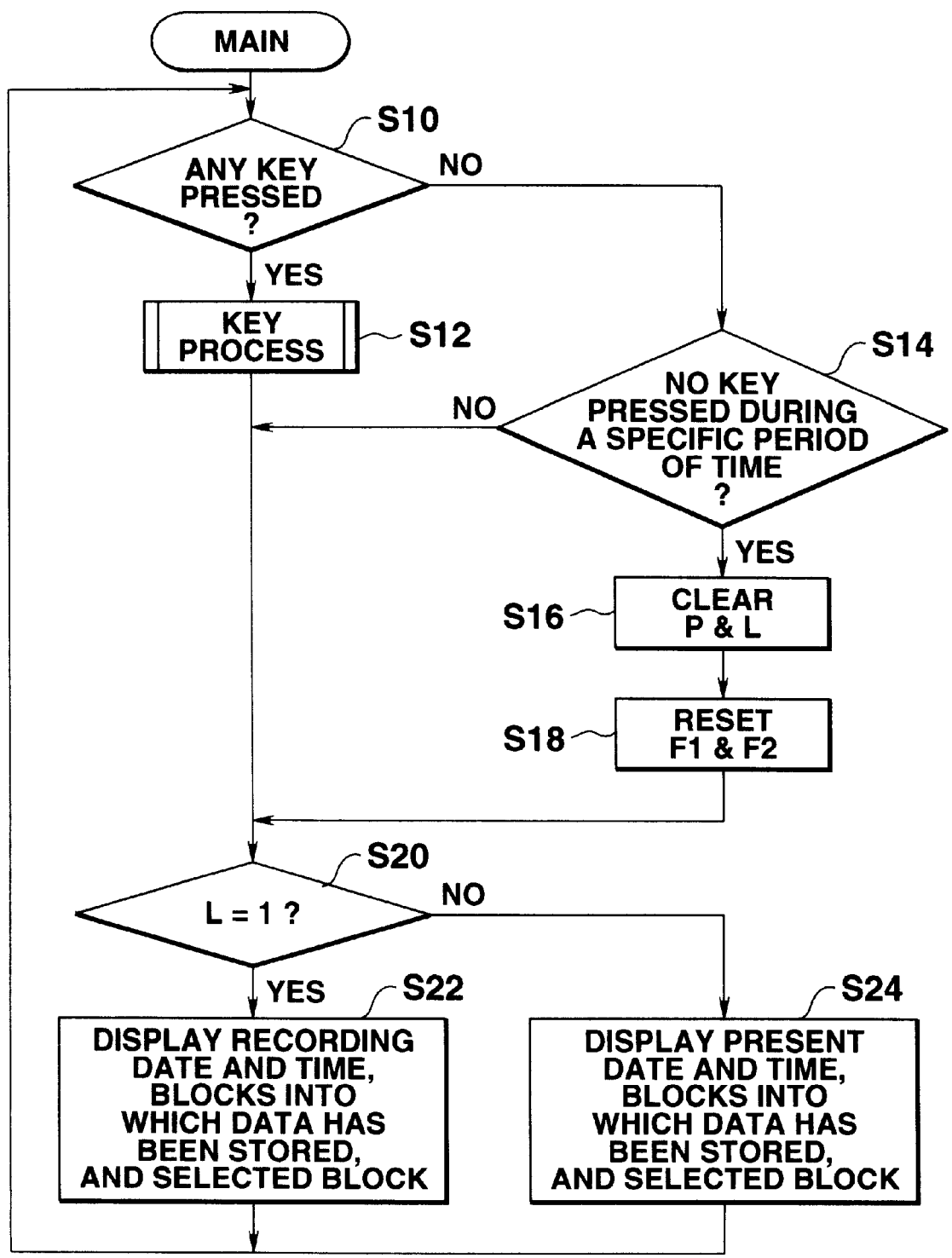
FIG. 5 is a flowchart to help explain the main operation.

FIG. 5 is a flowchart to help explain the main operation of the embodiment. Steps S10 to S24 explained below are the processes of determining the key input at the key input section 3, jumping to the process to be executed according to the presence or absence of the key input, and displaying various data items on the LCD display unit 14. At step S10, it is determined whether or not any key has been pressed at the key input section 3. If any key has been pressed, control will proceed to step S12. At step S12, the key process explained later will be executed according to the pressed key (the record key 3a, reproduce key 3b, select key 3c, or the other keys). If no key has been pressed, control will go to step S14, where it is determined whether or not no key has been pressed during a specified period of time. If no key has been pressed during the specified period of time, the record flag P and reproduce flag L will be cleared at step S16 and the flip-flops F1 and F2 will be reset. With the embodiment, recording or reproducing is effected while the record key 3a is being pressed or the reproduce key 3b is being pressed. Recording or reproducing is terminated when the record key 3a or reproduce key 3b is released. Step S16 or S18 is the process of terminating the recording or reproducing when the record key 3a or reproduce key 3b is released.

Figure 8:
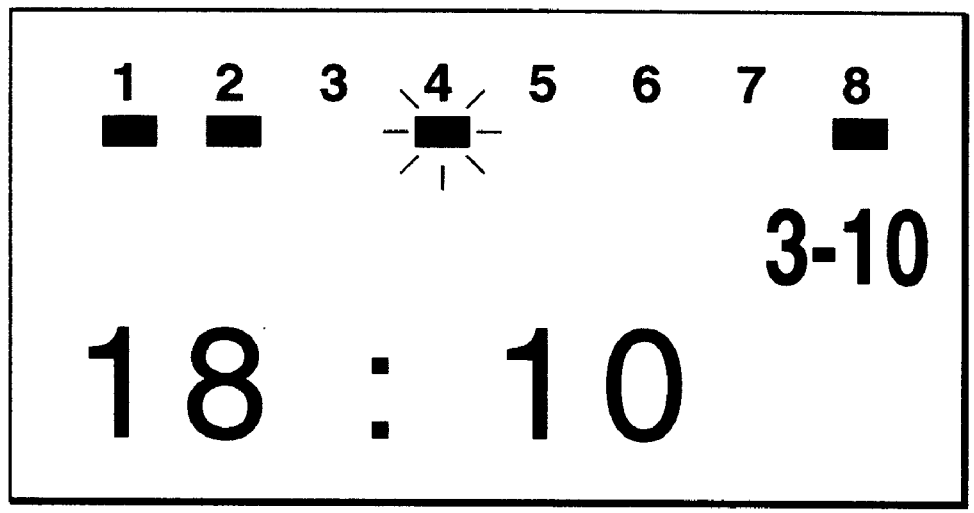
FIG. 8 shows an example of a reproduce mode representation on the LCD display unit 14 of FIG. 1.

When the key process at step S12 has been completed, when any key has been pressed during the specified period of time at step S14, or when step S18 has been terminated, control will proceed to step S20, where it will be determined whether of not the reproduce flag L is at "1." When the reproduce flag L is at "1." that is, in the reproduce mode, control will go to step S22, where the recording date and time, the blocks into which the data has already been stored, and the selected (specified) blocks will be displayed on the LCD display unit. Specifically, in the reproduce mode, as shown in FIG. 8, the LCD display unit displays numerals 1 to 8 indicating the blocks in the EEPROM 25 at the top and rectangular symbols indicating which blocks the audio data has been stored into below the respective numerals. In FIG. 8, the lighted rectangular symbols (the first, second, and eighth blocks in the figure) indicate the blocks into which the data has already been stored. The blinking rectangular symbols (the fourth block in the figure) indicates the selected block into which the data has already been stored and which is now being reproduced. Moreover, the LCD display unit displays the date (3-10) and time (18:10) stored in the register R3 in the RAM 9, which indicate the recording date and time at which the speech was stored in the fourth block.

Figure 9:
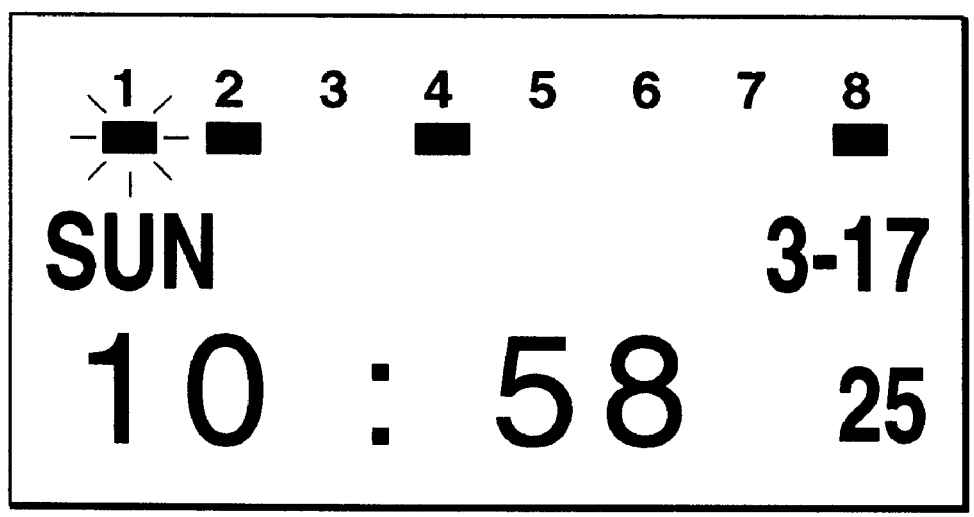
FIG. 9 shows an example of a record mode representation on the LCD display unit 14 of FIG. 1.

When the reproduce flag L is at "0," that is, when the mode is not the reproduce mode, control will proceed to step S24, where the present date and time, the blocks into which the data has already been stored, and the selected block will be displayed on the LCD display unit. Specifically, as shown in FIG. 9, on the LCD display unit, the lighted rectangular symbols (the second, fourth, and eighth blocks in the figure) indicate the blocks into which the data has already been stored and the blinking rectangular symbol (the first block in the figure) indicates the block into which the data is now being recorded. Furthermore, the LCD display unit also displays the day of the week (SUN), date (3-17), and time (10:58 25), the present time obtained at the time keeping circuit 6.

(2) Key Processing

Figure 6:
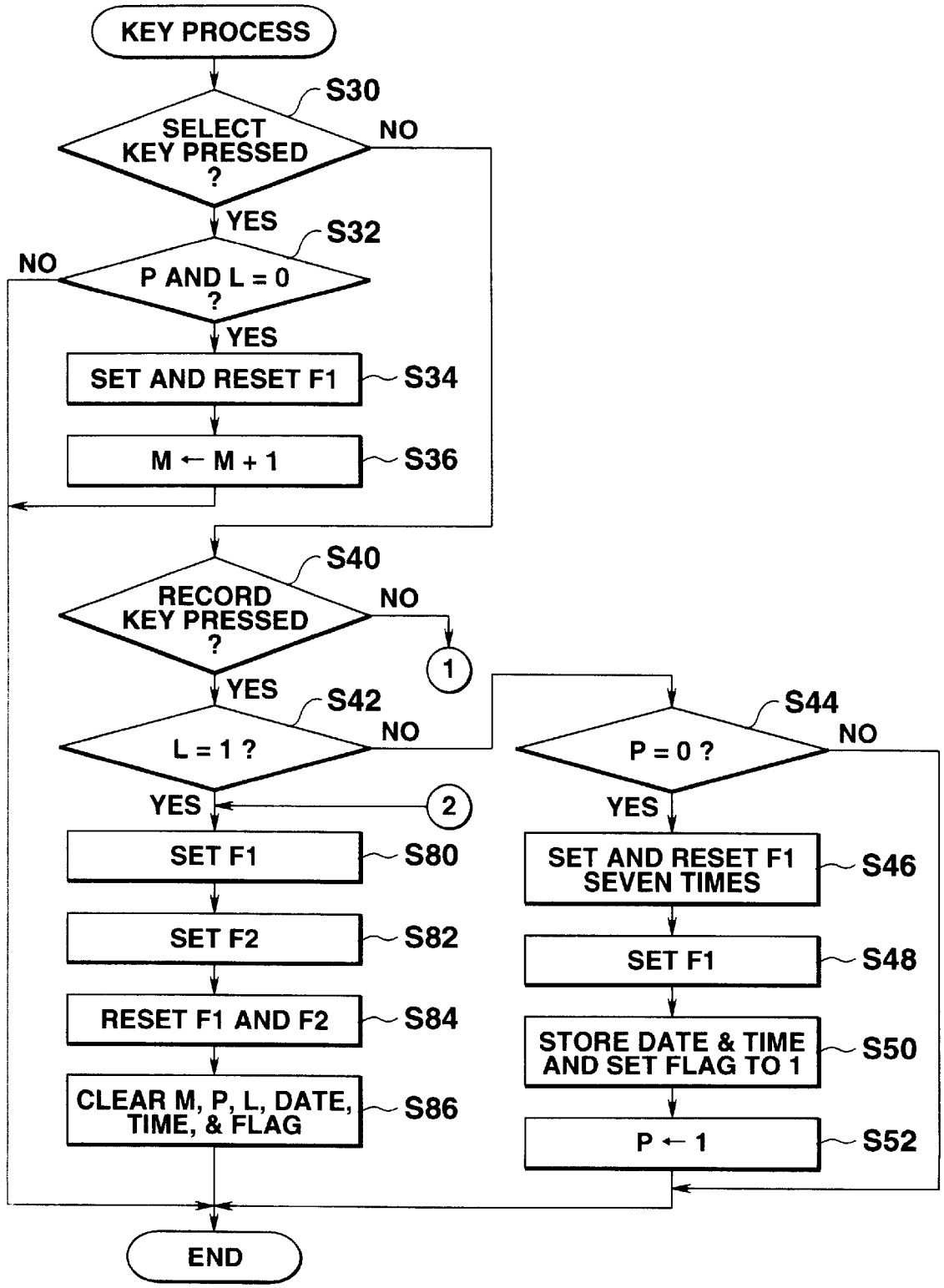
FIG. 6 is a flowchart to help explain the operation of key process of FIG. 5.
Figure 7:
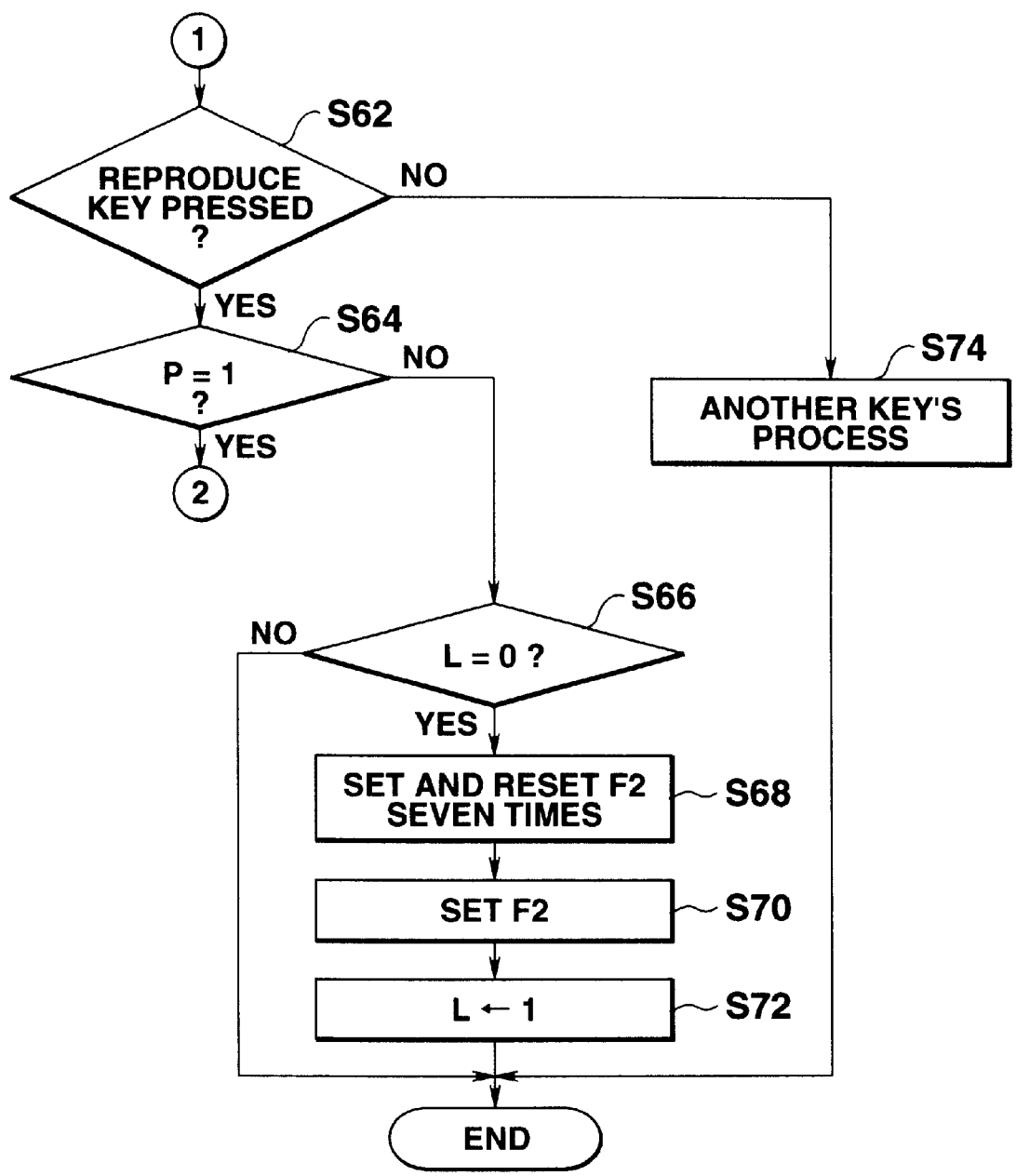
FIG. 7 is a flowchart to help explain the operation of key process of FIG. 5.

Next, the key process described above will be explained. FIGS. 6 and 7 are flowcharts to help explain the operation of the key process.

2-1. Block Selecting Process

Steps S30 to S36 explained below are the processes of determining which block the audio data is to be recorded into or reproduced from. First, at step S30, it is determined whether or not the select key 3c has been pressed. If the select key 3c has been pressed, control will proceed to step S32, where it will be determined whether or not the record flag P and reproduce flag L will be at "0." If the record flag P and reproduce flag 1 are at "0," that is, when the mode is neither the record mode nor the reproduce mode, control will proceed to step S34, where the flip-flop F1 will be set and reset so that the flip-flop F1 may send one pulse having a 1/256 period (256 Hz). This causes the output of the OR circuit 20a shown in FIG. 3 to go to "1," forcing the count in the block control section 21 to be incremented by one. Next, at step S36, the recording/reproducing block specifying data in the register M of the RAM 9 is incremented by one. Then, the key process is terminated.

As described above, the block is incremented by one in position by setting and resetting the flip-flop F1 once. Each time the select key 3c is pressed, the blocks is shifted circularly in this order: 1→2→3→ . . . →6→7→8→1→2→ . . . In this case, because the reproduce flag L is "0," when control returns to the main routine shown in FIG. 5, the representation shown in FIG. 8 will appear at step S24. The user selects the desired block by pressing the select key 3c until the desired block has been reached. When either the record flag P or the reproduce flag L is at "1," that is, when either the record mode or the reproduce mode is on, the judgment result at step S32 is NO, so that even if the select key 3c is pressed, the specified block will not be changed.

2-2. Record Mode

Steps S40 to S52 explained below are the recording process where the address control section 22 stores the audio data inputted from the microphone 23 and converted at the encoding circuit 24 into the block specified by the block specifying data BD. At step S30, when the select key 3c has not been pressed, control will proceed to step S40, where it will be determined whether or not the record key 3a has been pressed. If the record key 3a has been pressed, control will proceed to step S42, where it will be determined whether or not the reproduce flag L is at "1." If the reproduce flag 1 is at "1," this means that the record key 3a has been pressed with the reproduce key 3b pressed. If the reproduce flag L is at "0," this means that the record mode in which the audio data is stored in the EEPROM 25 has been selected.

When at step S42, the reproduce flag L is at "0," this means that the reproduce key 3b has not been pressed, so control goes to step S44, where it is determined whether or not the record flag P is at "0." If the record flag P is at "0," this means that the record key 3a has been pressed, so control will proceed to step S46.

At step S46, the setting and resetting of the flip-flop F1 is repeated seven times in a 1/256 period (256 Hz). The reason for this is to prevent the block already selected in the aforementioned block select process from changing in setting the flip-flop F1 for recording. Because in the embodiment, the EEPROM 25 is divided into eight blocks, the block specifying data BD in the block control section 21 is set to the block immediately before the selected block by repeating the setting and resetting of the flip-flop F1 seven times in a 1/256 period (256 Hz) in advance. Next, at step S48, the flip-flop F1 is set. This makes the block into which the audio data is to be recorded the selected block. Next, at step S50, the present date and time in the time keeping circuit 6 are stored in the date and time area (register T) of the corresponding block in the RAM 9. At the same time, the corresponding flag F is set to "1." Then, the record flag P is set to "1," and the current process is terminated. Forcing the record flag to "1" causes the judgment result to be "NO" at step S44 while the record key 3a is being pressed, so that steps S46 to S52 are executed once only when the record key 3a is pressed.

As a result, in the memory control integrated circuit 2, the record control signal S1 is supplied from the control section 20 to the address control section 22. Moreover, in the block selecting process, the 3-bit block specifying data BD set in the block control section 21 is supplied to the address control section 22. This enables the address control section 22 to store the audio data inputted from the microphone 23 and converted at the encoding circuit 24 into the block specified by the block specifying data BD. In this case, because the reproduce flag L is at "0," when control returns to the main routine shown in FIG. 5, the representation of FIG. 9 appears at step S24.

While the record key 3a is being pressed, the audio data continues to be stored into the EEPROM 25. When the record key 3a is released, the record flag P is cleared (=0) at step S16 of FIG. 5 and thereafter the flip-flop F1 is reset at step S18, which resets the flip-flop F3 of FIG. 3, terminating the recording of the audio data.

2-3. Reproduce Mode

Steps S62 to S72 explained below are the reproducing process of causing the decoding circuit 26 to covert the audio data stored in the block of the EEPROM 25 specified by the block specifying data in the address control section 22 into an analog signal while the reproduce key 3a is being pressed and outputting speech from the speaker 27 according to the audio signal. When either the select key 3c or the record key 3a has not been pressed, control will pass through step S30 and step S40 and go to step S62 of FIG. 7, where it will be determined whether or not the reproduce key 3b has been pressed. If the reproduce key 3b has been pressed, control will proceed to step S64, where it will be determined whether or not the record flag P is at "1." If the record flag at "1," this means that the reproduce key 3b has been pressed with the record key 3a pressed. If the record flag P is at "0," this means that the reproduce mode in which the audio data stored in the EEPROM 25 is reproduced has been selected.

When the record flag P is at "0" at step S64, the record key 3a has not been pressed. Then, control proceeds to step S66. At step S66, it is determined whether or not the reproduce flag L is at "0." If the reproduce flag L is at "0," this means that the reproduce key 3b has been pressed for the first time, and control will go to step S68.

At step S68, the setting and resetting of the flip-flop F2 is repeated seven times in a 1/256 period (256 Hz). The reason for this is to prevent the block already selected in the aforementioned block select process from changing in setting the flip-flop F2 and sending the reproducing control signal S2 as described earlier. The block specifying data BD in the block control section 21 is set to the block immediately before the selected block by repeating the setting and resetting of the flip-flop F2 seven times in a 1/256 period (256 Hz) in advance. Next, at step S70, the flip-flop F2 is set. This makes the block into which the audio data is to be recorded the selected block. Next, at step S72, the reproduce flag L is set to "1," and the current process is terminated. Forcing the reproduce flag to "1" causes the judgment result to be "NO" at step S66 while the reproduce key 3b is being pressed, so that steps S68 to S72 are executed once only when the record key 3b is pressed.

As a result, in the memory control integrated circuit 2, the reproducing control signal S2 is supplied from the control section 20 to the address control section 22. Moreover, in the block selecting process, the 3-bit block specifying data BD set in the block control section 21 is supplied to the address control section 22. This enables the decoding circuit 26 to convert the audio data stored in the block specified by the block specifying data BD in the address control section 22 into an analog signal, which is then outputted from the speaker 27. In this case, because the reproduce flag L is at "1," when control returns to the main routine shown in FIG. 5, the representation of FIG. 8 appears at step S22.

While the reproduce key 3b is being pressed, the audio data continues to be reproduced. When the record key 3b is released, the reproduced flag L is cleared (=0) at step S16 of FIG. 5 and thereafter the flip-flop F2 is reset at step S18, which terminates the reproducing of the audio data.

2-4. Clear Process

Steps S44 to S50 explained below are the clear process of erasing various flags and data items when the record key 3a and reproduce key 3b are pressed at the same time. In a case where the reproduce flag L has already been at "1" (step S42) when the record key 3a is pressed, or in a case where the record flag P has already been at "1" (step S64) when the reproduce key 3b is pressed, the clear processing at step 80 and later shown in FIG. 6 are executed. In other words, when the record key 3a is pressed with the reproduce key 3b pressed, or when the reproduce key 3b is pressed with the record key 3a pressed, this means that the record key 3a, together with the reproduce key 3b, is pressed, so the clear process is executed.

At step S80, the flip-flop F1 is set and at step S82, the flip-flop F2 is set. After both of the flip-flop F1 and flip-flop F2 have been set, the output of the AND circuit 20b goes to "1" in the control circuit 20 of FIG. 3, sending the clear signal CL to the address control section 22. This causes all of the audio data in the specified block to be cleared in unison. Next, at step S84, the flip-flops F1 and F2 are reset. At step S86, the recording/reproducing block specifying data M, record flag P, reproduce flag L, date and time, and flag F stored in the RAM 9 are cleared. Then, the current process is terminated.

While in the embodiment, the block control signal BL is inputted to the control section 20 via the terminal T1 to which the record specifying signal is inputted, the block control signal may be inputted to the control section 20 via the terminal T2 to which the reproduce specifying signal is inputted.

While in the embodiment, an example of applying the present invention to a portable electronic wristwatch, the present invention may be applied to various pieces of electronic equipment other than an electronic wristwatch. For instance, the invention may be applied to information apparatuses, such as a portable telephone, a pager, or an electronic notebook, or to various types of electronic apparatuses of the desktop type, not the portable type.

The memory for storing the audio data is not restricted to a flash EEPROM. It is possible to use other types of volatile memories or nonvolatile memories.

What is claimed is:

1. An audio storing and reproducing apparatus comprising:

a first semiconductor chip including:
a semiconductor memory having a plurality of storage areas into each of which audio data is stored;
a single storage specifying input terminal to which a storage area specifying signal for specifying a storage area to be stored into or reproduced from among the plurality of storage areas in said semiconductor memory and a storage specifying signal for specifying storage of audio data are inputted;
a sinale reproduce specifying input terminal to which a reproduce specifying signal for specifying reproduction of audio data is inputted; and
storage medium control means for (i) specifying a storage area to be stored into or reproduced from among the plurality of storage areas in said semiconductor memory according to said storage area specifying signal, (ii) storing audio data into the storage area specified by said storage specifying signal, and (iii) reading the audio data stored in the storage area specified by said reproduce specifying signal; and control means including:
a single storage area specifying switch that sequentially specifies the storage areas of said semiconductor memory for each operation of said single storage area specifying switch;
a single storage specifying switch;
a single reproduce specifying switch; and
a control circuit (1) that (i) sends said storage area specifying signal to the storage medium control means in said first semiconductor chip via said storage specifying input terminal when said storage area specifying switch is operated, (ii) sends said storage area specifying signal to the storage medium control means in said first semiconductor chip via said storage specifying input terminal and thereafter sends said storage specifying signal when said storage specifying switch is operated, and (iii) sends said reproduce specifying signal to the storage medium control means in said first semiconductor chip via said reproduce specifying input terminal when said reproduce specifying switch is operated.

2. An audio storing and reproducing apparatus according to claim 1, wherein said storage area specifying signal comprises a pulse signal, and said storage medium control means shifts the storage area to be stored into or reproduced from one place each time said pulse signal is supplied thereto.

3. An audio storing and reproducing apparatus according to claim 1, wherein said control circuit sends a number of pulse signals in a specific period as a storage area correction signal before specifying storing or reproducing of said audio data, and said number of pulse signals is equal to a number of the storage areas minus one.

4. An audio storing and reproducing apparatus according to claim 3, wherein said storage medium control means at least ANDs a pulse signal having a period of more than the specific period × the number of storage areas with said pulse signal having the specific period and, based on a result of a logical product thereof, distinguishes said storage area specifying signal and said storage area correction signal from said storage specifying signal and said reproduce specifying signal, respectively.

5. An audio storing and reproducing apparatus according to claim 1, wherein said semiconductor memory comprises a nonvolatile memory.

6. An audio storing and reproducing apparatus according to claim 1, wherein said control circuit and said first semiconductor chip are operated on different voltages.

7. An audio storing and reproducing apparatus according to claim 1, wherein said control circuit is provided on a second semiconductor chip different from said first semiconductor chip, and said first and second semiconductor chips are driven on different voltages.

8. An audio storing and reproducing apparatus comprising:

a first semiconductor chip including:
a semiconductor memory having a plurality of storage areas into each of which audio data is stored;
a single storage specifying input terminal to which a storage specifying signal for specifying storage of audio data is inputted;
a single reproduce specifying input terminal to which a storage area specifying signal for specifying a storage area to be stored into or reproduced from among the plurality of storage areas in said semiconductor memory and a reproduce specifying signal for specifying reproduction of audio data are inputted; and
storage medium control means for (i) specifying a storage area to be stored into or reproduced from among the plurality of storage areas in said semiconductor memory according to said storage area specifying signal, (ii) storing audio data into the storage area specified by said storage specifying signal, and (iii) reading the audio data stored in the storage area specified by said reproduce specifying signal; and control means including:
- a single storage area specifying switch that sequentially specifies the storage areas of said semiconductor memory for each operation of said single storage area specifying switch;
- a single storage specifying switch;
- a single reproduce specifying switch; and
- a control circuit (1) that (i) sends said storage area specifying signal to the storage medium control means in said first semiconductor chip via said reproduce specifying input terminal when said storage area specifying switch is operated, (ii) sends said storage specifying signal via said storage specifying input terminal when said storage specifying switch is operated, and (iii) sends said storage area specifying signal to the storage medium control means in said first semiconductor chip via said reproduce specifying input terminal when said reproduce specifying switch is operated and thereafter sends said reproduce specifying signal.

9. An audio storing and reproducing apparatus according to claim 8, wherein said storage area specifying signal comprises a pulse signal, and said storage medium control means shifts the storage area to be stored into or reproduced from one by one each time said pulse signal is supplied thereto.

10. An audio storing and reproducing apparatus according to claim 8, wherein said control circuit sends a number of pulse signals in a specific period as a storage area correction signal before specifying storing or reproducing of said audio data, and said number of pulse signals is equal to a number of the storage areas minus one.

11. An audio storing and reproducing apparatus according to claim 10, wherein said storage medium control means at least ANDs a pulse signal having a period of more than the specific period × the number of storage areas with said pulse signal having the specific period and, based on a result of a logical product thereof, distinguishes said storage area specifying signal and said storage area correction signal from said storage specifying signal and said reproduce specifying signal, respectively.

12. An audio storing and reproducing apparatus according to claim 8, wherein said semiconductor memory comprises a nonvolatile memory.

13. An audio storing and reproducing apparatus according to claim 8, wherein said control circuit and said first semiconductor chip are operated on different voltages.

14. An audio storing and reproducing apparatus according to claim 8, wherein said control circuit is provided on a second semiconductor chip different from said first semiconductor chip, and said first and second semiconductor chips are driven on different voltages.

* * * * *